April 26, 1966 R. A. WOLF ETAL 3,247,728

TUNER DEVICE

Filed Oct. 28, 1963 2 Sheets-Sheet 1

INVENTORS
Robert A. Wolf
Alfred J. Clark
By: Mueller & Aichele
Attys.

INVENTORS
Robert A. Wolf
Alfred J. Clark
By: Mueller & Aichele
Attys

United States Patent Office 3,247,728
Patented Apr. 26, 1966

3,247,728
TUNER DEVICE

Robert A. Wolf, Oak Lawn, and Alfred J. Clark, Palatine, Ill., assignors to Motorola, Inc., Franklin Park, Ill., a corporation of Illinois Filed Oct. 28, 1963, Ser. No. 319,256
5 Claims. (Cl. 74—10.33)

This invention relates to tuning apparatus for a combination AM–FM radio receiver, and more particularly to pushbutton tuning apparatus wherein each pushbutton assembly may be preprogramed to select a frequency for either AM or FM reception.

Combination AM–FM radio receivers mounted in automobiles are rapidly gaining popularity. Pushbutton tuning of automobile radios has always been a significant feature because of the convenience and minimization of distraction it affords to the driver. It would be possible in a combination AM–FM radio to provide a separate group of pushbuttons for FM tuning in addition to the usual number provided for AM tuning. Such a large number of buttons, however, gives the dash panel of the automobile a cluttered appearance. If the number of buttons provided for the combination AM–FM radio is limited to the five or so buttons now used for conventional AM receivers, versatility may be curtailed unless any one of the buttons may be preprogramed by the user to preselect either an AM or an FM station.

Heretofore, certain attempts at developing tuning apparatus for combination AM–FM radios, which apparatus contained push-buttons capable of being preprogramed by the user to preselect either AM or FM stations, have involved complex structures and elaborate switching systems. Often the result of such complexity and elaborateness was to render the tuning unreliable and difficult to operate.

Accordingly, it is an object of this invention to provide improved pushbutton tuning apparatus for a combination AM–FM receiver.

Another object of the invention is to provide reliable, low cost pushbutton tuning apparatus for an AM–FM radio receiver wherein any one of the pushbuttons may be preprogramed to select either an AM or an FM station.

A feature of the invention is the provision, in a pushbutton operable tuning mechanism for use in a combination AM–FM radio receiver, of a transversely movable member to actuate the AM or FM selector switch with a plurality of cam surfaces thereon engageable by adjustable cams on the pushbuttons.

Another feature of the invention is the provision, in a tuning device, of a plurality of linearly depressible pushbutton assemblies, each having a first cam thereon for adjustably positioning a tuner carriage, and a second adjustable cam engageable with surfaces on a transversely movable AM–FM selector switch actuating member.

Still another feature of the invention is the provision of a tuning device comprising a plurality of linearly depressible pushbutton assemblies, and of adjustable cams on the pushbuttons engageable with V-shaped projections in a transversely movable AM–FM selector switch actuating member. The selector switch actuating member may alternately have V-shaped notches for engagement by the adjustable cams.

In accordance with the invention, a tuning device for a combination AM–FM radio receiver includes a plurality of linearly displaceable pushbutton cam slides. Each of the cam slides carries a presettable cam which is engageable with a pair of treadle bars to align the same according to the setting of the cam. The treadle bars are linked through a carriage mechanism to tuning slugs for both the AM and FM portions of the receiver and accordingly, the position of the treadle bars governs the frequency to which the receiver is tuned for both AM and FM reception. Each cam slide is operable by a pushbutton which is accessible from outside of the receiver. A selector switch is provided for switching the receiver between AM and FM reception and is actuable by an actuating member which is linearly displaceable transversely of the cam slides. The actuating member is provided with a plurality of obliquely disposed cam surfaces thereon which are engageable to displace the actuating member for switching the receiver to AM or FM reception. Each pushbutton is provided with a switchable arm thereon which carries a cam pin engageable with respective ones of the cam surfaces on the actuating member according to the setting of the lever to switch the receiver to AM or FM reception when the pushbutton is depressed.

In one form of the invention, the cam surfaces on the actuating member are formed by a plurality of V-shaped projections on the actuating member respectively aligned with the pushbuttons. In another form of the invention the oblique cam surfaces are formed by a plurality of V-shaped notches in the actuating member respectively aligned with the pushbuttons. By utilizing the presettable cam on the cam slide in combination with an appropriate setting of the switchable arm on the underside of the particular pushbutton associated with the cam slide, each pushbutton may be set to tune the receiver to a predetermined frequency for either AM or FM reception.

Figure 1:
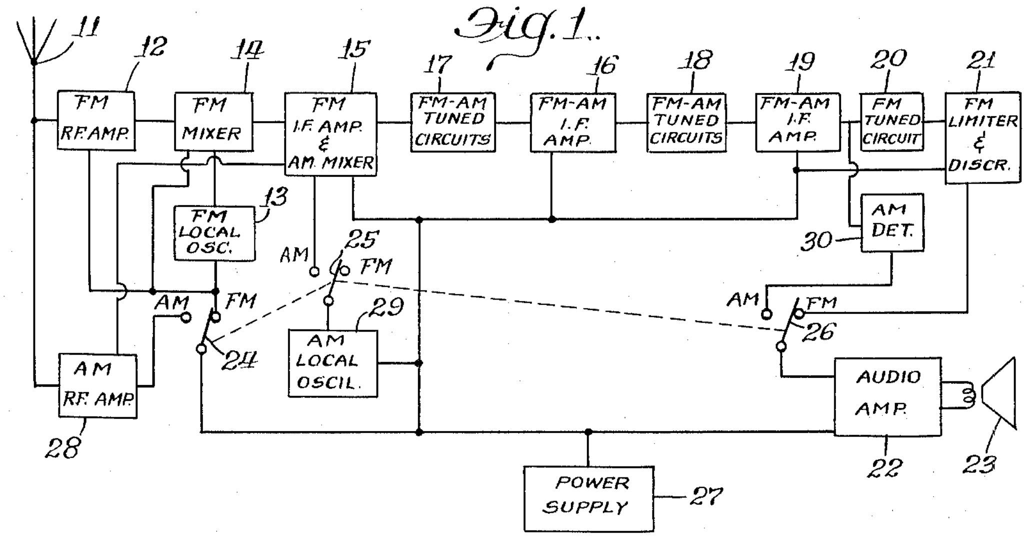
FIG. 1 is a schematic diagram of a combination AM–FM receiver in which the invention may be incorporated.

Referring now to FIG. 1, a combination AM–FM receiver of the type in which the invention may be incorporated is shown schematically. With the receiver operating in FM mode, signals from antenna 11 are applied to radio frequency amplifier 12 and are then heterodyned against signals from local oscillator 13 in mixer 14. The intermediate frequency signals from mixer 14 are applied to a first intermediate frequency amplifier 15 and are then coupled to a second intermediate frequency amplifier 16 through FM tuned circuit 17. A further FM tuned circuit 18 couples intermediate frequency amplifier 16 to a final intermediate frequency amplifier 19. Tuned circuit 20 couples the output of intermediate frequency amplifier 19 to limiter and discriminator stages 21 which provide audio signals applied through switch 26 to the audio amplifier 22 and speaker 23.

When operating in AM mode, switches 24, 25 and 26 are moved from the positions shown in FIG. 1 to the AM positions. Switch 24 will therefore disconnect power supply 27 from the FM radio frequency amplifier and mixer and local oscillator and connect it to the AM radio frequency amplifier 28. Signals from antenna 11 are thereby amplified by amplifier 28 and applied to the AM mixer stage 15 which also serves as the first intermediate frequency amplifier for the FM mode of operation. Signals from AM local oscillator 29 are heterodyned against signals from radio frequency amplifier 28 in mixer 15 and are coupled through AM tuner circuit 17 to intermediate frequency amplifier 16. AM tuned circuit 18 couples amplifier 16 to amplifier 19, the output of which is applied to AM detector 30. Switch 26 then couples the output of AM detector 30 to the audio amplifier 22 and from there to speaker 23. Switches 24, 25 and 26 are ganged for simultaneous operation to switch the receiver from AM reception to FM reception, and vice versa.

Figure 2:
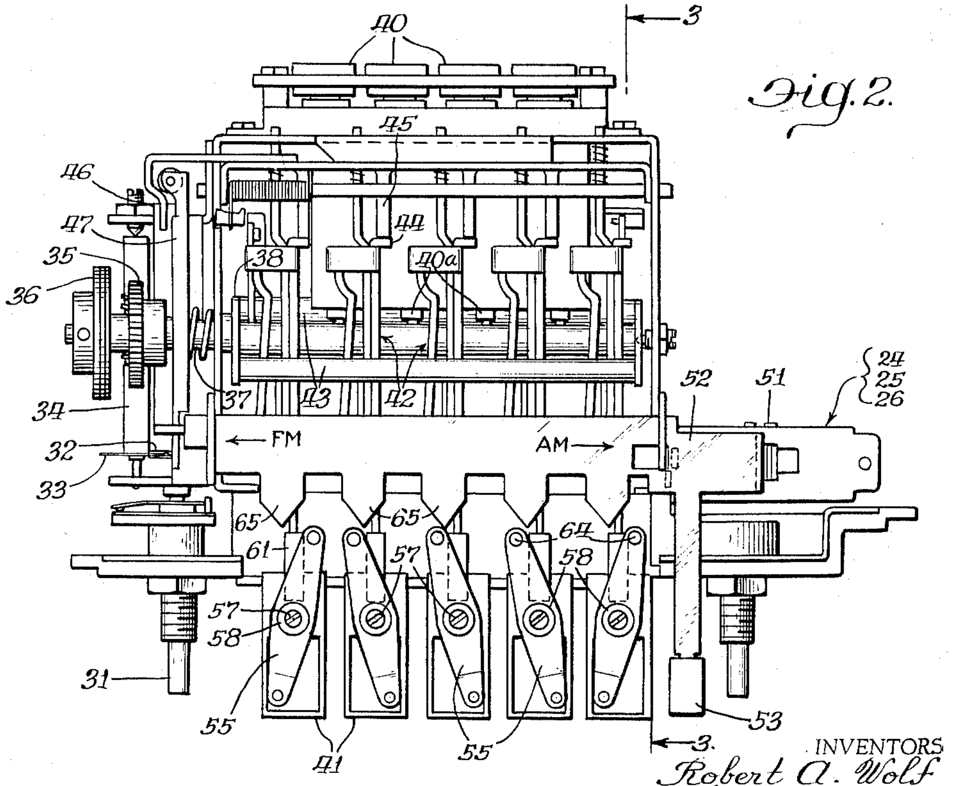
FIG. 2 is a bottom plan view of a tuner mechanism constructed in accordance with the invention.
Figure 3:
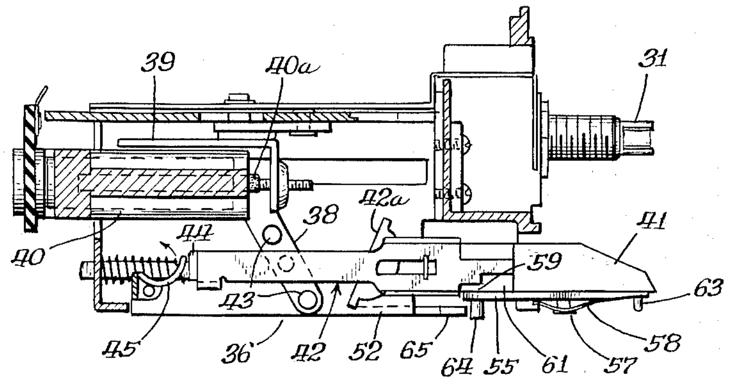
FIG. 3 is a sectional view taken along the line 3—3 of FIG. 2.

Referring now to FIGS. 2 and 3 there is shown a tuning device for use in connection with the radio receiver illustrated in FIG. 1. The tuning device shown is of the preprogramed pushbutton selector type commonly in use on automobile radio receivers. A tuning control shaft 31, which may extend through the front of the dash panel in the automobile and be manually operable by a knob, is coupled through a pinch washer 32 and disk 33 to drive pinion gear 34. Gear 34 engages drive gear 35 which is coupled through clutch 36 to tuner shaft 37. Tuner shaft 37 drives treadle arms 38 which position tuning carriage 39 to control the positioning of tuning slugs 40*a* in tuning coils 40. Certain of the coils 40 control the tuning for AM operation of the receiver and other of the coils 40 control the tuning for FM operation. As a result, control shaft 31 may be turned to tune the receiver when operating in either AM or FM mode.

The receiver may also be tuned by a plurality of pushbuttons 41 which extend from the front of the receiver through the dash panel of the automobile. Each pushbutton controls a respective slide member 42 which carries a presettable cam 42*a* for engaging a pair of treadle bars 43. Treadle bars 43 are connected to treadle arms 38 which operate the tuning carriage 39. Accordingly, the positioning of the various cams on the slide members 42 will align treadle bars 43 in a preset position and tune coils 40 to a given frequency.

Cam slides 42 each have a portion 44 engageable with a clutch actuating lever 45. Upon the depression of a bushbutton 41 and corresponding cam slide 42, cam actuating lever 45 will be pivoted in the direction of the arrow in FIG. 3 to cause cam 46 to pivot a lever 47. Lever 47 is connected to disengage clutch 36 when pivoted and decouple the tuning shaft 31 from the carriage assembly. The operation of the tuner thus far described is similar to that of the AM tuner shown in the Patent No. 2,793,531 issued to R. E. Thompson, and assigned to the assignee of the present invention.

Ganged switches 24, 25 and 26 are actuable by switch button 51. Button 51 in turn is actuable by movement of an actuator plate 52. A handle 53 may extend from plate 52 outwardly of the receiver and may be manually moved to selectively move plate 52 in the direction designated by the arrow in FIG. 2 to thereby operate the receiver from AM to FM modes and vice versa.

In addition to the manual switching provision, the tuner of the invention is also automatically switched between the two modes according to the pre-programming of the various pushbutton slide assemblies. Each of pushbuttons 41 carries on the underside thereof a pivotal lever 55. Each of levers 55 are held to their respective pushbuttons by a screw 57 and spring washer 58. A small projection 59 on lever 55 engages the outside of the center slide receiving portion 61 of pushbutton 41 to render the lever bistable between two positions. The lever may be switched between the two positions by applying sufficient manual pressure to the projections 63 to cause projection 59 to ride over the center portion 61 against the bias of spring washer 58.

Each of levers 55 carries a cam pin 64 on the end thereof. Plate 52 is provided with a plurality of V-shaped projections 65 in alignment with respective ones of pushbuttons 41. Projections 65 form a pair of oblique surfaces and since the movement of plate 52 is transverse to the movement of cam slides 42, engagement of these surfaces will move the slide between AM and FM positions. For example, slide 52 is shown in FIG. 2 in the FM position, and depression of either of the three middle pushbuttons 41 will cause the pins 64 on the levers associated therewith to engage the appropriate surface of projection 65 to move the slide 52 to the AM position. If the cam slides are pre-programmed for a particular AM frequency, depression of that pushbutton will automatically switch the tuner to the AM mode of reception while at the same time tuning it to the AM frequency. Similarly, a pushbutton wherein the associated lever 55 is positioned in the FM position will return the slide to the FM position for FM reception. Each pushbutton slide assembly may therefore be pre-programmed to a particular frequency for either AM or FM reception, and the lever 55 associated therewith moved to an appropriate position to switch to the particular mode of operation desired. Upon depression of the pushbutton, the tuner will then automatically select the band and the frequency in the band. Any combination of AM and FM frequencies, or all AM or all FM frequencies may be preprogrammed on the tuner of the invention in a simple operation performed by the user of the receiver.

Figure 4:
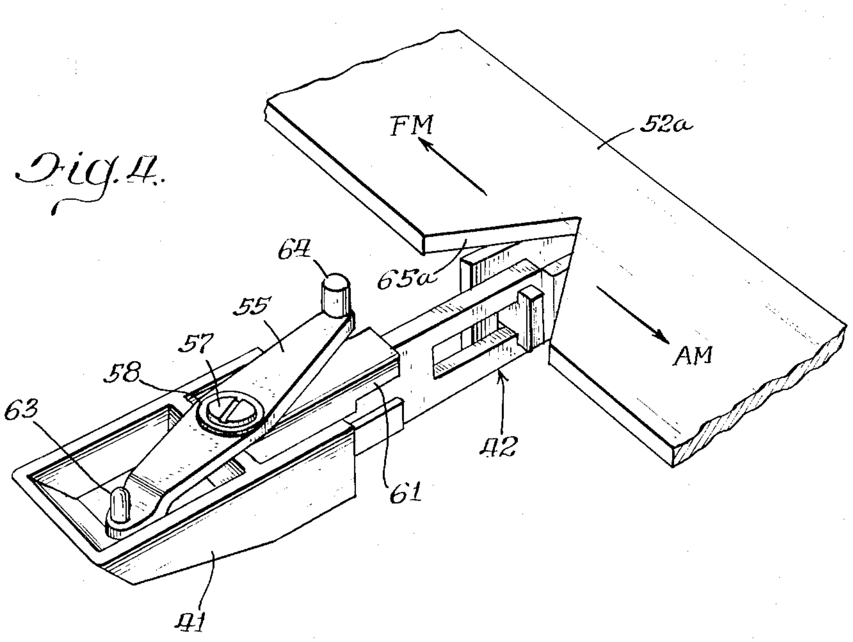
FIG. 4 is a perspective view illustrating a further embodiment of the invention.

Referring now to FIG. 4, a variation in the form of slide 52 may be seen. The slide 52*a* of FIG. 4 is provided with a V-notch 65*a* therein which constitutes the appropriate camming surfaces for moving the slide 52*a* to FM or AM positions. The assembly of the pushbutton, including lever 55, is identical with that shown in FIGS. 2 and 3.

It may therefore be seen that the invention provides an improved pushbutton tuning device for a combination AM–FM receiver which is reliable and low in cost, and wherein any of the pushbuttons may be preprogrammed to select either AM or FM stations.

We claim:

1. A tuning mechanism for use in a combination FM–AM radio receiver, including in combination, a selector switch actuable to FM and AM positions for FM and AM modes of reception respectively, a plurality of pushbutton cam slide assemblies each comprising a presettable cam slide linearly displaceable to tune the receiver to given frequencies for FM and AM reception and a manually depressible pushbutton fixed to said slide and accessible from outside of the receiver for linearly displacing said slide, a selector switch actuating member linearly displaceable transversely to the displacement of said cam slides and having a plurality of oblique cam surfaces thereon engageable to displace said actuating member to selectively actuate said selector switch to FM and AM positions, and a cam on the underside of each of said pushbuttons, each of said cams being manually switchable to selectively engage an appropriate one of said cam surfaces on said actuating member to actuate said selector switch to FM and AM positions, whereby each of said pushbutton cam slide assemblies may be selectively preset for tuning the receiver to a given frequency and a given mode of reception.

2. A tuning mechanism for use in a combination FM–AM radio receiver, including in combination, a selector switch actuable to FM and AM positions for FM and AM modes of reception respectively, a plurality of pushbutton cam slide assemblies, each comprising a presettable cam slide linearly displaceable to tune the receiver to given frequencies for FM and AM reception and further comprising a manually depressible pushbutton fixed to said slide and accessible from outside of the receiver for linearly displacing said slide, a selector switch actuating member linearly displaceable transversely to the displacement of said cam slides, said selector switch actuating member having a plurality of first oblique cam surfaces thereon and a plurality of second oblique surfaces thereon aligned in pairs with respective ones of said pushbuttons, said first cam surfaces being disposed to be engageable to displace said actuating member to actuate said selector switch to FM position and said second cam surfaces being disposed to be engageable to displace said actuating member to actuate said selector switch to AM position, and a cam on the underside of each of said pushbuttons, each of said cams being manually switchable to selectively engage an appropriate one of said first and second cam surfaces on said actuating member to actuate said selector switch to FM and AM positions, whereby each of said pushbutton cam slide assemblies may be selectively preset for tuning the receiver to a given frequency and a given mode of reception.

3. A tuning mechanism for use in a combination FM–AM radio receiver, including in combination, a selector switch actuable to FM and AM positions for FM and AM modes of reception respectively, a plurality of pushbutton cam slide assemblies each comprising a presettable cam slide linearly displaceable to tune the receiver to given frequencies for FM and AM reception and further comprising a manually depressible pushbutton fixed to said slide and accessible from the outside of the receiver for linearly displacing said slide, a selector switch actuating member linearly displaceable transversely to the displacement of said cam slides, said selector switch actuating member having a plurality of first oblique cam surfaces thereon and a plurality of second oblique cam surfaces thereon aligned in pairs with respective ones of said pushbuttons, said first cam surfaces being disposed to be engageable to displace said actuating member to actuate said selector switch to FM position and said second cam surfaces being disposed to be engageable to displace said actuating member to actuate said selector switch to AM position, and a bi-stable lever on the underside of each of said pushbuttons, each of said levers having a cam pin extending therefrom and being manually switchable between first and second positions to selectively engage one of said first and second cam surfaces respectively upon depression of its associated pushbutton to actuate said selector switch to FM and AM positions, whereby each of said pushbutton cam slide assemblies may be selectively preset for tuning the receiver to a given frequency and a given mode of reception.

4. A tuning mechanism for use in a combination FM–AM radio receiver, including in combination, a selector switch actuatble to FM and AM positions for FM and AM modes of reception respectively, a plurality of pushbutton cam slide assemblies each comprising a presettable cam slide linearly displaceable to tune the receiver to given frequencies for FM and AM reception and further comprising a manually depressible pushbutton fixed to said slide and accessible from outside the receiver for linearly displacing said slide, a selector switch actuating member linearly displaceable transversely to the displacement of said cam slides and having a plurality of projections extending therefrom, each of said projections being in alignment with a respective one of said pushbuttons and having a pair of cam surfaces thereon forming a V-shaped point, said cam surfaces being engageable to displace said actuating member to selectively actuate said selector switch to FM and AM positions, and a cam on the underside of each of said pushbuttons, each of said cams being manually switchable to selectively engage an appropriate one of said cam surfaces on said projections aligned therewith upon depression of its associated pushbutton to actuate said selector switch to FM and AM positions, whereby each of said pushbutton cam slides assemblies may be selectively preset for tuning the receiver to a given frequency and a given mode of reception.

5. A tuning mechanism for use in a combination FM–AM radio receiver, including in combination, a selector switch actuable to FM and AM positions for FM and AM modes of reception respectively, a plurality of pushbutton cam slide assemblies each comprising a presettable cam slide linearly displaceable to tune the receiver to given frequencies for FM and AM reception and further comprising a manually depressible pushbutton fixed to said slide and accessible from outside of the receiver for linearly displacing said slide, a selector switch actuating member linearly displaceable transversely to the displacement of said cam slides, said actuating member having a plurality of V-shaped notches therein aligned with respective ones of said pushbuttons, said notches having oblique cam surfaces therein engageable to displace said actuating member to selectively actuate said selector switch to FM and AM positions, and a cam on the underside of each of said pushbuttons, each of said cams being manually switchable to selectively engage an appropriate one of said cam surfaces in said V-notch aligned therewith upon depression of its associated pushbutton to actuate said selector switch to FM and AM positions, whereby each of said pushbutton cam slide assemblies may be selectively preset for tuning the receiver to a given frequency and a given mode of reception.

References Cited by the Examiner

UNITED STATES PATENTS 2,898,767 8/1959 Teaf -------------- 74—10.33

MILTON KAUFMAN, *Primary Examiner.*